(12) United States Patent
Yamazaki et al.

(10) Patent No.: US 11,261,299 B2
(45) Date of Patent: Mar. 1, 2022

(54) BLOCK COPOLYMER AND METHOD OF PRODUCING THE SAME, AND METHOD OF PRODUCING STRUCTURE CONTAINING PHASE-SEPARATED STRUCTURE

(71) Applicants: TOKYO OHKA KOGYO CO., LTD., Kawasaki (JP); TOKYO INSTITUTE OF TECHNOLOGY, Tokyo (JP)

(72) Inventors: Akiyoshi Yamazaki, Kawasaki (JP); Daisuke Kawana, Kawasaki (JP); Takehiro Seshimo, Kawasaki (JP); Teruaki Hayakawa, Tokyo (JP); Lei Dong, Tokyo (JP); Rin Odashima, Tokyo (JP)

(73) Assignees: Tokyo Ohka Kogyo Co., Ltd., Kawasaki (JP); Tokyo Institute of Technology, Tokyo (JP)

( * ) Notice: Subject to any disclaimer, the term of this patent is extended or adjusted under 35 U.S.C. 154(b) by 114 days.

(21) Appl. No.: 16/286,232

(22) Filed: Feb. 26, 2019

(65) Prior Publication Data

US 2019/0270852 A1 Sep. 5, 2019

(30) Foreign Application Priority Data

Mar. 5, 2018 (JP) .............................. JP2018-039127

(51) Int. Cl.
*C08F 283/12* (2006.01)
*C08G 77/04* (2006.01)
*G03F 7/20* (2006.01)
*C08G 77/442* (2006.01)
*C08G 77/26* (2006.01)
*C08G 77/28* (2006.01)

(52) U.S. Cl.
CPC .......... *C08G 77/442* (2013.01); *C08F 283/12* (2013.01); *C08G 77/045* (2013.01); *G03F 7/70408* (2013.01); *C08G 77/26* (2013.01); *C08G 77/28* (2013.01)

(58) Field of Classification Search
CPC ............. C08F 230/085; C08F 283/122; C08F 283/00; C08F 299/08; C08F 297/00; C08F 297/02; C08G 77/26; C08G 77/04; C08G 77/22; C08G 77/045; C08G 77/442
See application file for complete search history.

(56) References Cited

U.S. PATENT DOCUMENTS 3,673,272 A * 6/1972 Dean ..................... C08F 297/02
525/103
3,691,257 A * 9/1972 Kendrick ............ C08L 2666/14
525/90
5,296,574 A * 3/1994 Hoxmeier ............ C08G 77/442
528/25
5,741,859 A * 4/1998 Saxena ..................... C08F 8/42
525/106
2012/0046415 A1 2/2012 Millward et al.
2015/0183935 A1 7/2015 Chang et al.
2016/0072148 A1 * 3/2016 Lee ......................... C08L 65/00
429/313
2016/0122579 A1 * 5/2016 Wu .......................... G03F 7/038
216/67
2016/0257789 A1 9/2016 Seshimo et al.
2018/0244856 A1 * 8/2018 Hayakawa ............ C08F 297/02

FOREIGN PATENT DOCUMENTS

JP 2008-036491 A 2/2008
JP 2015-129261 A 7/2015
JP 2016-166323 9/2016
JP 2017-133026 A 8/2017

OTHER PUBLICATIONS

Hinsberg et al., "Self-Assembling Materials for Litographic Patterning: Overview, Status and Moving Forward", *Proceedings of SPIE*, 7637, 76370G-1 to 76370G-11, 2010.
Bates et al., "Block Copolymer Thermodynamics: Theory and Experiment", *Annu. Rev. Phys. Chem.* 1990, 41:525-57.
Office Action in Japanese Patent Application No. 2018-039127 dated Oct. 26, 2021.

* cited by examiner

*Primary Examiner* — Irina S Zemel
*Assistant Examiner* — Jeffrey S Lenihan
(74) *Attorney, Agent, or Firm* — Knobbe Martens Olson & Bear LLP

(57) ABSTRACT

A block copolymer including a first block consisting of a polymer having a repeating structure of a structural unit (u1) containing no silicon atom, and a second block consisting of a polymer having a repeating structure of a structural unit (u2) containing a silicon atom, the second block containing a block (b21) consisting of a polymer having a repeating structure represented by general formula (u2-1), and a block (b22) consisting of a polymer having a repeating structure of a structural unit (u22) containing a silicon atom, and the block (b22) is positioned between the first block and the block (b21) (wherein $R^{P211}$ represents an alkyl group, a halogenated alkyl group, a hydrogen atom, or an organic group having a polar group; and $R^{P212}$ represents an organic group having a polar group).

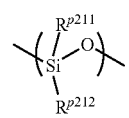

5 Claims, 1 Drawing Sheet

BLOCK COPOLYMER AND METHOD OF PRODUCING THE SAME, AND METHOD OF PRODUCING STRUCTURE CONTAINING PHASE-SEPARATED STRUCTURE

TECHNICAL FIELD

The present invention relates to a block copolymer and a method of producing the same, and a method of producing structure containing phase-separated structure.

Priority is claimed on Japanese Patent Application No. 2018-039127, filed on Mar. 5, 2018, the content of which is incorporated herein by reference.

DESCRIPTION OF RELATED ART

Recently, as further miniaturization of large scale integrated circuits (LSI) proceeds, a technology for processing a more delicate structure is demanded. In response to such demand, attempts have been started to be made on a technology in which a fine pattern is formed using a phase-separated structure formed by self-assembly of a block copolymer having mutually incompatible blocks bonded together. (For example, Patent Literature 1).

For using a phase-separation structure of a block copolymer, it is necessary to form a self-organized nano structure by a microphase separation only in specific regions, and arrange the nano structure in a desired direction. For realizing position control and orientational control, processes such as graphoepitaxy to control phase-separated pattern by a guide pattern and chemical epitaxy to control phase-separated pattern by difference in the chemical state of the substrate are proposed (see, for example, Non-Patent Document 1).

A block copolymer forms a regular periodic structure by phase separation. The periodic structure changes to a cylinder, a lamellar or a sphere, depending on the volume ratio or the like of the polymer components. Further, it is known that the period depends on the molecular weight.

Attempts have been made to form fine patterns having a perpendicular cylinder shape in which cylinders are oriented in a perpendicular direction, a horizontal cylinder shape in which cylinders are oriented in a horizontal direction, and a perpendicular lamellar shape in which lamellar structures are oriented in a perpendicular direction. For example, in Patent Literature 2, attempts have been made to improve the perpendicularity of the pattern by introducing a polar group at the terminal of a side chain of a block copolymer of polystyrene and a siloxane derivative.

DOCUMENTS OF RELATED ART

Patent Literature

[Patent Document 1] Japanese Unexamined Patent Application, First Publication No. 2008-36491
[Patent Literature 2] Japanese Unexamined Patent Application, First Publication No. 2016-166323

Non-Patent Documents

[Non-Patent Document 1] Proceedings of SPIE (U.S.), vol. 7637, pp. 76370G-1 (2010)
[Non-Patent Document 2] Annu. Rev. Phys. Chem. 41 525 (1990)

SUMMARY OF THE INVENTION

By the method described in Patent Literature 2, although the perpendicularity of the pattern could be improved, there was still room for improvement in the roughness after etching.

Non-Patent Literature 2 describes that, in a block copolymer constituted of a block A and a block B, the interface thickness (t) between the block A and the block B satisfies the relationship represented by the following formula (1).

[Chemical Formula 1]

$$t = a \cdot \chi^{-1/2} \quad (1)$$

In the formula, t represents the interface thickness between block A and block B of a block copolymer constituted of a block A and a block B; a represents a parameter indicating the size of the monomer; $\chi$ indicates an interaction parameter. The larger the value of the interaction parameter, the higher the phase-separation performance As shown in formula (1), the larger the interaction parameter $\chi$, the smaller the interface thickness t.

For example, in the case of patterning using a block copolymer constituted of a block A and a block B, since one of the blocks is selectively removed by dry etching or the like, the interface between the block A and the block B becomes the edge portion.

At the interface between the block A and the block B, a component constituting the block A and a component constituting the block B are present in a mixed state. Variation in the component at the interface become a cause of roughness after etching. Therefore, it is expected that roughness may be improved by reducing the interface thickness t.

In general, in the case of a diblock copolymer having a high interaction parameter $\chi$, although the interface thickness t becomes small, the difference in the surface free energy between the blocks becomes large. Therefore, at the time of heat annealing for formation of a phase-separated structure, the block having a small surface free energy is segregated at the surface of the block copolymer film. As a result, there was a problem in that it became difficult to form a perpendicularly oriented pattern suitable for microfabrication.

The present invention takes the above circumstances into consideration, with an object of providing a block copolymer preferable for self-directed assembly, the method of producing the same, and a method of producing a structure containing a phase-separated structure.

A first aspect of the present invention is a block copolymer including a first block consisting of a polymer having a repeating structure of a structural unit (u1) containing no silicon atom, and a second block consisting of a polymer having a repeating structure of a structural unit (u2) containing a silicon atom; the second block containing a block (b21) consisting of a polymer having a repeating structure of a structural unit (u21) represented by general formula (u2-1) shown below, and a block (b22) consisting of a polymer having a repeating structure of a structural unit (u22) containing a silicon atom, provided that the structural unit (u21) is excluded; and the block (b22) is positioned between the first block and the block (b21).

[Chemical Formula 2]

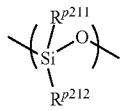

(u2-1)

In the formula, $R^{P211}$ represents an alkyl group, a halogenated alkyl group, a hydrogen atom, or an organic group having a polar group; and $R^{P212}$ represents an organic group having a polar group.

A second aspect of the present invention is a method of producing a block copolymer, including: a step (a) of preparing a first block consisting of a polymer having a repeating structure of a structural unit (u11) represented by general formula (u1-1) shown below or a polymer having a repeating structure of a structural unit (u12) derived from an acrylate ester which may have the hydrogen atom bonded to the carbon atom on the α-position substituted with a substituent, a step (b) of conducting addition polymerization of a siloxane or a monomer (m222) represented by general formula (m2-2-2) shown below with the first block prepared in the step (a), to prepare a block copolymer precursor in which the first block is bonded to a block (b22), and a step (c) of conducting addition polymerization of a monomer (m21) which derives a structural unit (u21) represented by general formula (u2-1) shown below with the block copolymer precursor prepared in the step (b), to prepare a block copolymer in which the block (b22) is positioned between the first block and a block (b21), wherein, in the step (c), the reaction temperature of the addition polymerization of the monomer (m21) with the block copolymer precursor is adjusted to be lower than the reaction temperature of the addition polymerization of the siloxane or the monomer (m222) with the first block.

[Chemical Formula 3]

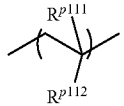

(u1-1)

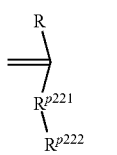

(m2-2-2)

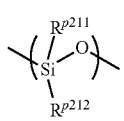

(u2-1)

wherein $R^{P111}$ represents an alkyl group, a halogenated alkyl group or a hydrogen atom; $R^{P112}$ represents an aromatic cyclic group which may have a substituent; R represents a hydrogen atom, an alkyl group having 1 to 5 carbon atoms or a halogenated alkyl group having 1 to 5 carbon atoms; $R^{P221}$ represents a divalent linking group; $R^{P222}$ represents an organic group having a silicon atom; $R^{P211}$ represents an alkyl group, a halogenated alkyl group, a hydrogen atom, or an organic group having a polar group; and $R^{P212}$ represents an organic group having a polar group.

A third aspect of the present invention is a method of producing a structure containing a phase-separated structure, the method including a step (i) in which a layer containing the block copolymer according to the first aspect is formed on a substrate, and a step (ii) in which the layer containing the block copolymer is phase-separated.

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with a fluorine atom.

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent that substitutes the hydrogen atom bonded to the carbon atom on the α-position is atom other than hydrogen or a group, and examples thereof include an alkyl group of 1 to 5 carbon atoms, a halogenated alkyl group of 1 to 5 carbon atoms and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from a hydroxystyrene derivative" refers to a structural unit that is formed by the cleavage of the ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

A "styrene derivative" refers to a compound in which the hydrogen atom on the α-position of styrene is substituted with a substituent such as an alkyl group, a halogenated alkyl group or the like.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The term "exposure" is used as a general concept that includes irradiation with any form of radiation.

According to the present invention, there are provided a block copolymer preferable for self-directed assembly, a method of producing the same, and a method of producing a structure containing a phase-separated structure.

DETAILED DESCRIPTION OF THE INVENTION

<<Block Copolymer>>

Figure 1:
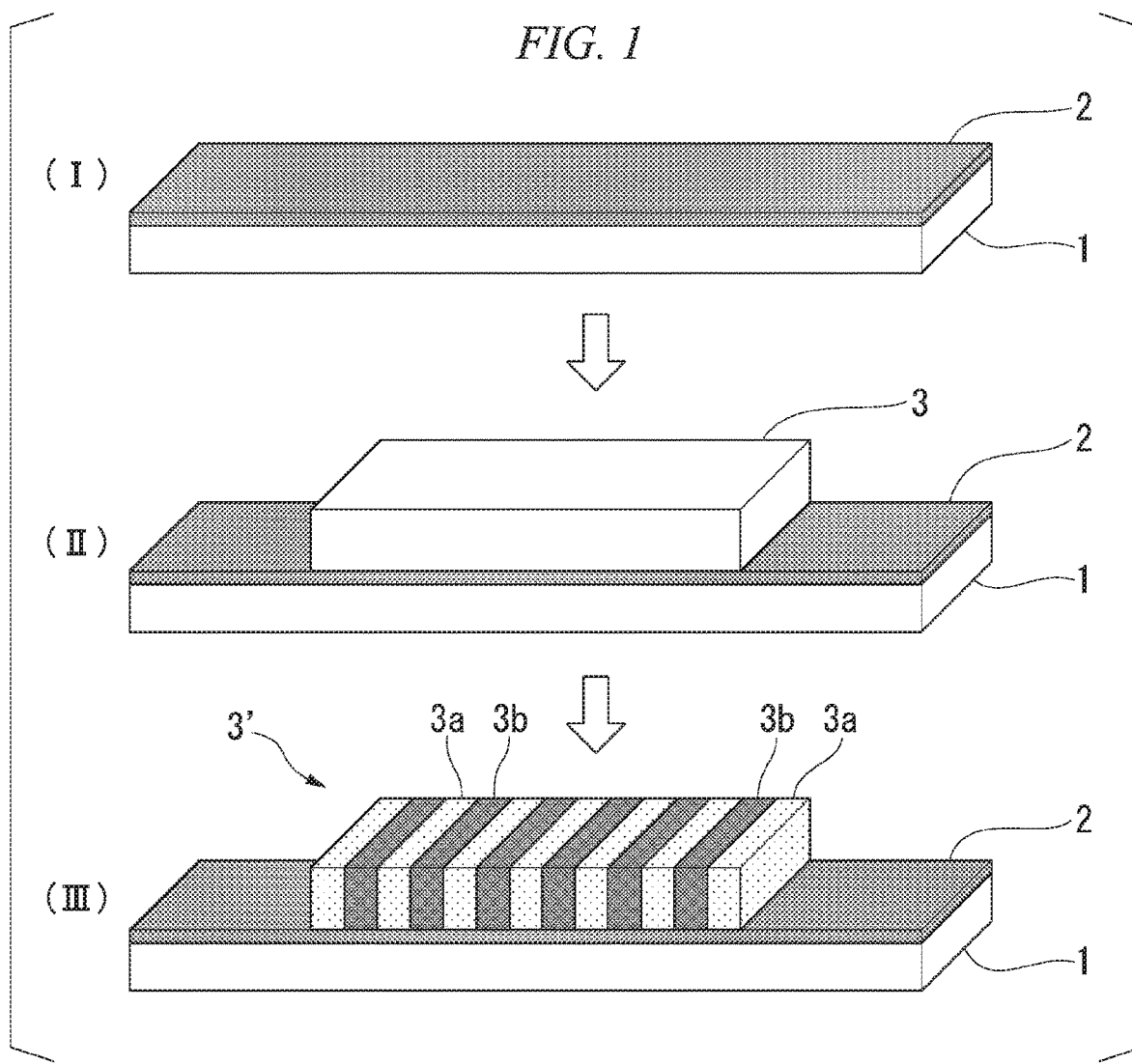
FIG. 1 is a schematic diagram showing an example of one embodiment of the method of forming a structure containing a phase-separated structure according to the present invention.

The block copolymer according to the present embodiment includes a first block consisting of a polymer having a repeating structure of a structural unit (u1) containing no silicon atom, and a second block consisting of a polymer having a repeating structure of a structural unit (u2) containing a silicon atom.

In the present embodiment, a "block copolymer" refers to a polymeric material in which plurality of blocks (partial constitutional components in which the same kind of structural unit is repeatedly bonded) are bonded. As the blocks constituting the block copolymer, 2 kinds of blocks may be used, or 3 or more kinds of blocks may be used.

<First Block>

In the present embodiment, the first block is not particularly limited, as long as it is a polymer having a repeating structure of a structural unit (u1) containing no silicon atom. Examples of the first block include a polymer having a repeating structure of a structural unit (u11) represented by general formula (u1-1) shown below, and a structural unit (u12) derived from an acrylate ester which may have the hydrogen atom bonded to the carbon atom on the α-position substituted with a substituent.

[Chemical Formula 4]

(u1-1)

wherein $R^{P111}$ represents an alkyl group, a halogenated alkyl group or a hydrogen atom; and $R^{P112}$ represents an aromatic cyclic group which may have a substituent.

(Structural Unit (u11))

In general formula (u1-1), $R^{P111}$ represents an alkyl group, a halogenated alkyl group or a hydrogen atom.

As the alkyl group for $R^{P111}$, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group for $R^{P111}$ include groups in which part or all of the hydrogen atoms within the aforementioned alkyl groups has been substituted with a halogen atom. Examples of the halogen atom include a fluorine atom, a chlorine atom, a bromine atom and an iodine atom.

Among these examples, as $R^{P111}$, an alkyl group, a halogenated alkyl group or a hydrogen atom is preferable, an alkyl group of 1 to 5 carbon atoms, a halogenated alkyl group of 1 to 5 carbon atoms or a hydrogen atom is more preferable, and a methyl group or a hydrogen atom is most preferable.

In general formula (u1-1), $R^{P112}$ represents an aromatic cyclic group which may have a substituent.

Examples of the aromatic cyclic group for $R^{P112}$ include a phenyl group, a naphthyl group, a biphenyl group, an anthracenyl group, and a pyridyl group. Among these examples, as the aromatic cyclic group for $R^{P112}$, a phenyl group or a naphthyl group is preferable, and a phenyl group is more preferable.

Examples of substituents for the aromatic cyclic group represented by $R^{P112}$ include an alkyl group of 1 to 5 carbon atoms, a halogen atom, and a halogenated alkyl group of 1 to 5 carbon atoms.

Specific examples of the alkyl group of 1 to 5 carbon atoms include a methyl group, an ethyl group, a propyl group, an isopropyl group, an n-butyl group, an isobutyl group, a tert-butyl group, a pentyl group, an isopentyl group, and a neopentyl group.

Examples of the halogen atom include a fluorine atom, a chlorine atom, a bromine atom and an iodine atom.

Examples of the halogenated alkyl group include groups in which part or all of the hydrogen atoms within the aforementioned alkyl groups has been substituted with the aforementioned halogen atoms.

(Structural Unit (u12))

In the present embodiment, examples of the structural unit (u12) include a structural unit derived from methyl acrylate, a structural unit derived from ethyl acrylate, a structural unit derived from propyl acrylate, a structural unit derived from n-butyl acrylate, a structural unit derived from t-butyl acrylate, a structural unit derived from cyclohexyl acrylate, a structural unit derived from octyl acrylate, a structural unit derived from nonyl acrylate, a structural unit derived from hydroxyethyl acrylate, a structural unit derived from hydroxypropyl acrylate, a structural unit derived from benzyl acrylate, a structural unit derived from anthracene acrylate, a structural unit derived from glycidyl acrylate, a structural unit derived from 3,4-epoxycyclohexylmethane acrylate, a structural unit derived from methyl methacrylate, a structural unit derived from ethyl methacrylate, a structural unit derived from propyl methacrylate, a structural unit derived from n-butyl methacrylate, a structural unit derived from t-butyl methacrylate, a structural unit derived from cyclohexyl methacrylate, a structural unit derived from octyl methacrylate, a structural unit derived from nonyl methacrylate, a structural unit derived from hydroxyethyl methacrylate, a structural unit derived from hydroxypropyl methacrylate, a structural unit derived from benzyl methacrylate, a structural unit derived from anthracene methacrylate, a structural unit derived from glycidyl methacrylate, and a structural unit derived from 3,4-epoxycyclohexylmethane methacrylate.

Among these examples, as the structural unit (u12), a structural unit derived from methyl acrylate, a structural unit derived from ethyl acrylate, a structural unit derived from t-butyl acrylate, a structural unit derived from methyl methacrylate, a structural unit derived from ethyl methacrylate, or a structural unit derived from t-butyl methacrylate is preferable.

<Second Block>

In the present embodiment, the second block contains a block (b21) consisting of a polymer having a repeating structure of a structural unit (u21) represented by general formula (u2-1) shown below, and a block (b22) consisting of a polymer having a repeating structure of a structural unit (u22) containing a silicon atom, and the block (b22) is positioned between the first block and the block (b21).

[Chemical Formula 5]

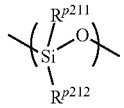

(u2-1)

In the formula, $R^{P211}$ represents an alkyl group, a halogenated alkyl group, a hydrogen atom, or an organic group having a polar group; and $R^{P212}$ represents an organic group having a polar group.

(Structural Unit (u21))

In general formula (u2-1), $R^{P211}$ represents an alkyl group, a halogenated alkyl group, a hydrogen atom, or an organic group having a polar group.

Examples of the organic group in the "organic group having a polar group" for $R^{P211}$ include a monovalent hydrocarbon group which may have a substituent. The hydrocarbon group may be either an aliphatic hydrocarbon group or an aromatic hydrocarbon group.

Aliphatic Hydrocarbon Group for $R^{P211}$

The "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given.

Linear or Branched Aliphatic Hydrocarbon Group

Examples of the linear or branched aliphatic hydrocarbon group include an alkyl group, an alkenyl group and an alkynyl group. Examples of the alkyl group include alkyl groups of 1 to 20 carbon atoms (preferably 1 to 10 carbon atoms, more preferably 1 to 6 carbon atoms) such as a methyl group, an ethyl group, a propyl group, an isopropyl group, a butyl group, an isobutyl group, a s-butyl group, a t-butyl group, a pentyl group, a hexyl group, a heptyl group, an octyl group, a 2-ethylhexyl group, a nonyl group and a decyl group. Examples of the alkenyl group include alkenyl groups of 2 to 20 carbon atoms (preferably 2 to 10 carbon atoms, and more preferably 2 to 6 carbon atoms), such as a vinyl group, an allyl group and a butenyl group. Examples of the alkynyl group include alkynyl groups of 2 to 20 carbon atoms (preferably 2 to 10 carbon atoms, and more preferably 2 to 6 carbon atoms), such as an ethynyl group and a propynyl group.

The linear or branched aliphatic hydrocarbon group may or may not have a substituent. Examples of the substituent include a fluorine atom, a fluorinated alkyl group of 1 to 5 carbon atoms, and a carbonyl group.

Aliphatic Hydrocarbon Group Containing a Ring in the Structure Thereof

As examples of the hydrocarbon group containing a ring in the structure thereof, an alicyclic hydrocarbon group, a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given.

Examples of the alicyclic hydrocarbon group include a 3- to 8-membered ring cycloalkyl group, such as a cyclopropyl group, a cyclobutyl group, a cyclopentyl group, a cyclohexyl group, a cycloheptyl group or a cyclooctyl group; a 3- to 8-membered ring cycloalkenyl group, such as a cyclopentenyl group or a cyclohexenyl group; a bridged cyclic hydrocarbon group of 4 to 20 carbon atoms (preferably 7 to 12 carbon atoms), such as an adamantyl group or a norbornyl group.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Aromatic Hydrocarbon Group for $R^{P211}$

The aromatic hydrocarbon group is a hydrocarbon group having at least one aromatic ring.

The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hetero ring include a pyridine ring and a thiophene ring.

Specific examples of the aromatic hydrocarbon group include a group in which one hydrogen atom has been removed from the aforementioned aromatic hydrocarbon ring or aromatic hetero ring (aryl group or heteroaryl group); a group in which one hydrogen atom has been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

Examples of the polar group in the "organic group having a polar group" for $R^{P211}$ include —OH, —C(=O)OH, —O—, —C(=O)—, —C(=O)—O—, —SH, —SO$_3$H, —S—, —C(=S)—, —S(=O)—, —S(=O)$_2$—, —S(=O)$_2$—O—, —NH$_2$, —N=, —NH—, and —C(=O)NH—.

In general formula (u2-1), the alkyl group for $R^{P211}$ is the same as defined for the alkyl group for the aliphatic hydrocarbon group represented by $R^{P211}$. Examples of the halogenated alkyl group for $R^{P211}$ include groups in which part or all of the hydrogen atoms within the aforementioned alkyl groups has been substituted with a halogen atom. Examples of the halogen atom include a fluorine atom, a chlorine atom, a bromine atom and an iodine atom.

The structural unit (u21) is preferably a structural unit represented by general formula (u2-1-1) shown below.

[Chemical Formula 6]

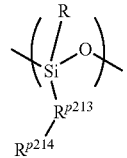

(u2-1-1)

In the formula, R represents a hydrogen atom, an alkyl group of 1 to 5 carbon atoms or a halogenated alkyl group of 1 to 5 carbon atoms; $R^{P213}$ represents a divalent linking group; and $R^{P214}$ represents an organic group having a polar group.

In general formula (u2-1-1), R represents a hydrogen atom, an alkyl group of 1 to 5 carbon atoms or a halogenated alkyl group of 1 to 5 carbon atoms.

Examples of the alkyl group of 1 to 5 carbon atoms represented by R include a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group for R include groups in which part or all of the hydrogen atoms within the aforementioned alkyl groups has been substituted with a halogen atom. Examples of the halogen atom include a fluorine atom, a chlorine atom, a bromine atom and an iodine atom.

Among these examples, as R, a methyl group or a hydrogen atom is preferable.

In general formula (u2-1-1), $R^{P213}$ represents a divalent linking group. The divalent linking group is not particularly limited, and preferable examples thereof include a divalent hydrocarbon group which may have a substituent and a divalent linking group containing a hetero atom.

Divalent Hydrocarbon Group which May have a Substituent:

In the case where $R^{P213}$ is a divalent linking group which may have a substituent, the hydrocarbon group may be either an aliphatic hydrocarbon group or an aromatic hydrocarbon group.

Aliphatic Hydrocarbon Group for $R^{P213}$

The "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof can be given.

Linear or Branched Aliphatic Hydrocarbon Group

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferred, and specific examples include various alkylalkylene groups, including alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group within the alkylalkylene group, a linear alkyl group of 1 to 5 carbon atoms is preferable.

The linear or branched aliphatic hydrocarbon group may or may not have a substituent. Examples of the substituent include a fluorine atom, a fluorinated alkyl group of 1 to 5 carbon atoms, and a carbonyl group.

Aliphatic Hydrocarbon Group Containing a Ring in the Structure Thereof

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Aromatic Hydrocarbon Group for $R^{P213}$

The aromatic hydrocarbon group is a hydrocarbon group having at least one aromatic ring.

The aromatic ring is not particularly limited, as long as it is a cyclic conjugated compound having (4n+2)π electrons, and may be either monocyclic or polycyclic. The aromatic ring preferably has 5 to 30 carbon atoms, more preferably 5 to 20, still more preferably 6 to 15, and most preferably 6 to 12. Here, the number of carbon atoms within a substituent(s) is not included in the number of carbon atoms of the aromatic hydrocarbon group. Examples of the aromatic ring include aromatic hydrocarbon rings, such as benzene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hetero ring include a pyridine ring and a thiophene ring.

Specific examples of the aromatic hydrocarbon group include a group in which two hydrogen atoms have been removed from the aforementioned aromatic hydrocarbon ring or aromatic hetero ring (arylene group or heteroarylene group); a group in which two hydrogen atoms have been removed from an aromatic compound having two or more aromatic rings (biphenyl, fluorene or the like); and a group in which one hydrogen atom of the aforementioned aromatic hydrocarbon ring or aromatic hetero ring has been substituted with an alkylene group (a group in which one hydrogen atom has been removed from the aryl group within the aforementioned arylalkyl group such as a benzyl group, a phenethyl group, a 1-naphthylmethyl group, a 2-naphthylmethyl group, a 1-naphthylethyl group, or a 2-naphthylethyl group, or a heteroarylalkyl group). The alkylene group which is bonded to the aforementioned aryl group or heteroaryl group preferably has 1 to 4 carbon atoms, more preferably 1 or 2 carbon atoms, and most preferably 1 carbon atom.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

Divalent Linking Group Containing a Hetero Atom

In the case where $R^{P213}$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (may be substituted with a substituent such as an alkyl group, an acyl group or the like), —S—, —S(=O)$_2$—, —S(=O)$_2$—O—, and a group represented by general formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m'''}$—Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represents a divalent hydrocarbon group which may have a substituent, O represents an oxygen atom, and m' represents an integer of 0 to 3].

In the case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In general formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m'''}$—Y$^{22}$—, —Y$^{21}$—O—C(=O)—Y$^{22}$— or —Y$^{21}$—S(=O)$_2$—O—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m''}$—Y$^{22}$—, m" represents an integer of 0 to 3, preferably an integer of 0 to 2, more preferably 0 or 1, and most preferably 1. Namely, it is particularly desirable that the group represented by the formula —[Y$^{21}$—C(=O)—O]$_{m''}$—Y$^{22}$— is a group represented by the formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

As $R^{P213}$, a linear or alkylene group of 1 to 10 carbon atoms is preferable, a linear or alkylene group of 1 to 6 carbon atoms is more preferable, and a linear or alkylene group of 1 to 3 carbon atoms still is preferable.

In general formula (u2-1-1), $R^{P214}$ represents an organic group having a polar group, and is the same as defined for the "organic group having a polar group" represented by $R^{P211}$ in the aforementioned general formula (u2-1).

As the organic group having a polar group represented by $R^{P214}$, a group represented by general formula ($R^{P214}$-1) shown below, a group represented by general formula ($R^{P214}$-2) shown below or a group represented by general formula ($R^{P214}$-3) shown below is preferable.

[Chemical Formula 7]

In the formulae, $R_O$ represents —OH, —C(=O)OH or a hydrocarbon group containing —O—, —C(=O)—, —C(=O)—O— or —OH in the structure thereof, $R_S$ represents —SH, —SO$_3$H or a hydrocarbon group containing —S—, —C(=S)—, —S(=O)—, —S(=O)$_2$— or —S(=O)$_2$—O— in the structure thereof, and $R_N$ represents —NH$_2$ or a hydrocarbon group containing —N=, —NH— or —C(=O)NH— in the structure thereof.

In general formula ($R^{P214}$-1), $R_O$ represents —OH, —C(=O)OH or a hydrocarbon group containing —O—, —C(=O)—, —C(=O)—O— or —OH in the structure thereof. With respect to the "hydrocarbon group containing —O—, —C(=O)—, —C(=O)—O— or —OH in the structure thereof" for $R_O$, the hydrocarbon group may be either an aliphatic hydrocarbon group or an aromatic hydrocarbon group.

The aliphatic hydrocarbon group may be either saturated or unsaturated, but in general, the aliphatic hydrocarbon group is preferably saturated.

Examples of the aliphatic hydrocarbon group include a cyclic group which may have a substituent, a chain alkyl group which may have a substituent, and a chain alkenyl group which may have a substituent.

With respect to "hydrocarbon group containing —O—, —C(=O)—, —C(=O)—O— or —OH in the structure thereof" for $R_O$, the cyclic group is preferably a cyclic hydrocarbon group. The cyclic hydrocarbon group may be an aromatic hydrocarbon group or an aliphatic hydrocarbon group.

With respect to the "hydrocarbon group containing —O—, —C(=O)—, —C(=O)—O— or —OH in the structure thereof" for $R_O$, examples of the aromatic hydrocarbon group include an aryl group in which 1 hydrogen atom has been removed from the aromatic hydrocarbon ring or the aromatic compound having two or more aromatic rings mentioned in relation to the divalent aromatic hydrocarbon group for $R^{P13}$ in the aforementioned general formula (u1-1-1). As the aromatic hydrocarbon group, a phenyl group or a naphthyl group is preferable.

With respect to the "hydrocarbon group containing —O—, —C(=O)—, —C(=O)—O— or —OH in the structure thereof" for $R_O$, examples of the cyclic aliphatic hydrocarbon group include a group in which 1 hydrogen atom has been removed from the monocycloalkane or the polycycloalkane mentioned in relation to the divalent hydrocarbon group for $R^{P13}$ in the aforementioned general formula (u1-1-1). As the cyclic aliphatic hydrocarbon group, a cyclopentyl group or a cyclohexyl group is preferable.

Examples of the substituent for the cyclic hydrocarbon group in the "hydrocarbon group containing —O—, —C(=O)—, —C(=O)—O— or —OH in the structure thereof" for $R_O$ include an alkyl group, an alkoxy group, a halogen atom, a halogenated alkyl group, a hydroxyl group, a carbonyl group and a nitro group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

The chain alkyl group in the "hydrocarbon group containing —O—, —C(=O)—, —C(=O)—O— or —OH in the structure thereof" for $R_O$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10.

Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The chain alkenyl group in the "hydrocarbon group containing —O—, —C(=O)—, —C(=O)—O— or —OH in the structure thereof" for $R_O$ may be linear or branched. The chain alkenyl group preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Examples of the substituent for the chain alkyl group of the chain alkenyl group in the "hydrocarbon group containing —O—, —C(=O)—, —C(=O)—O— or —OH in the structure thereof" for $R_O$ include an alkoxy group, a halogen atom, a halogenated alkyl group, a hydroxy group, a carbonyl group, a nitro group, an amino group, and a cyclic group in the "hydrocarbon group containing —O—, —C(=O)—, —C(=O)—O— or —OH in the structure thereof" for $R_O$.

As the group represented by general formula ($R^{P214}$-1), a group represented by any one of chemical formulae ($R^{P214}$-1-1) to ($R^{P214}$-1-9) shown below is preferable. In chemical formula ($R^{P214}$-1-9), np1 is an integer of 1 to 10.

[Chemical Formula 8]

($R^{P214}$-1-1)

($R^{P214}$-1-2)

($R^{P214}$-1-3)

($R^{P214}$-1-4)

($R^{P214}$-1-5)

($R^{P214}$-1-6)

(R$^{P214}$-1-7)

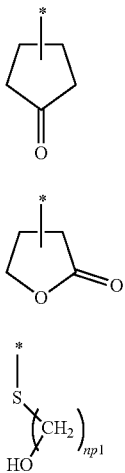

(R$^{P214}$-1-8)

(R$^{P214}$-1-9)

In general formula (R$^{P214}$-2), R$_S$ represents —SH, —SO$_3$H or a hydrocarbon group containing —S—, —C(=S)—, —S(=O)—, —S(=O)$_2$— or —S(=O)$_2$—O— in the structure thereof.

The hydrocarbon group in the "hydrocarbon group containing —S—, —C(=S)—, —S(=O)—, —S(=O)$_2$— or —S(=O)$_2$—O— in the structure thereof" for R$_S$ is the same as defined for the hydrocarbon group in the "hydrocarbon group containing —O—, —C(=O)—, —C(=O)—O— or —OH in the structure thereof" for R$_O$ in the aforementioned general formula (R$^{P15}$-1).

As the group represented by general formula (R$^{P214}$-2), a group represented by any one of chemical formulae (R$^{P214}$-2-1) to (R$^{P214}$-2-12) shown below is preferable.

[Chemical Formula 9]

(R$^{P214}$-2-1)

SH

(R$^{P214}$-2-2)

SO$_3$H

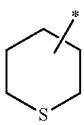

(R$^{P214}$-2-3)

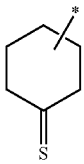

(R$^{P214}$-2-4)

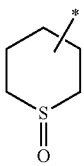

(R$^{P214}$-2-5)

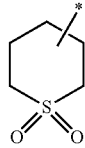

(R$^{P214}$-2-6)

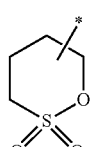

(R$^{P214}$-2-7)

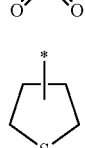

(R$^{P214}$-2-8)

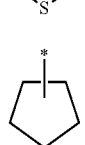

(R$^{P214}$-2-9)

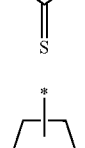

(R$^{P214}$-2-10)

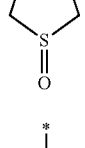

(R$^{P214}$-2-11)

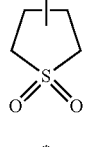

(R$^{P214}$-2-12)

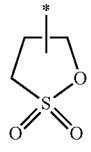

In general formula (R$^{P214}$-3), R$_N$ represents —NH$_2$ or a hydrocarbon group containing —N=, —NH— or —C(=O)NH— in the structure thereof.

As the hydrocarbon group in the "hydrocarbon group containing —N=, —NH— or —C(=O)NH— in the structure thereof" represented by R$_N$, the same hydrocarbon group as those described above for the "hydrocarbon group containing —O—, —C(=O)—, —C(=O)—O— or —OH in the structure thereof" represented by R$_O$ in (R$^{P214}$-1).

As the group represented by general formula (R$^{P214}$-3), a group represented by any one of chemical formulae (R$^{P214}$-3-1) to (R$^{P214}$-3-12) shown below is preferable.

In formula (R$^{P214}$-3-2), R$^{P2140}$ represents an arbitrary organic group. The organic group for R$^{P2140}$ is not particularly limited, and examples thereof include the same organic groups as those described above for the "organic group having a polar group" in the aforementioned general formula (u2-1).

[Chemical Formula 10]

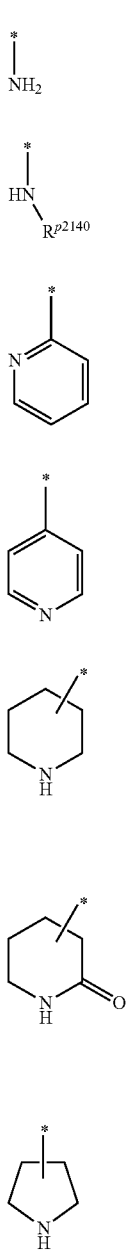

(R^{P214}-3-1)
(R^{P214}-3-2)
(R^{P214}-3-3)
(R^{P214}-3-4)
(R^{P214}-3-5)
(R^{P214}-3-6)
(R^{P214}-3-7)
(R^{P214}-3-8)

In general formula (u2-1-1), $R^{P214}$ is preferably at least one member selected from the group consisting of groups represented by any of the aforementioned chemical formulae ($R^{P214}$-1-1) to ($R^{P214}$-1-9), the aforementioned chemical formulae ($R^{P214}$-2-1) to ($R^{P214}$-2-12) and the aforementioned chemical formulae ($R^{P214}$-3-1) to ($R^{P214}$-3-12).

Specific examples of the structural unit (u21) are shown below.

[Chemical Formula 11]

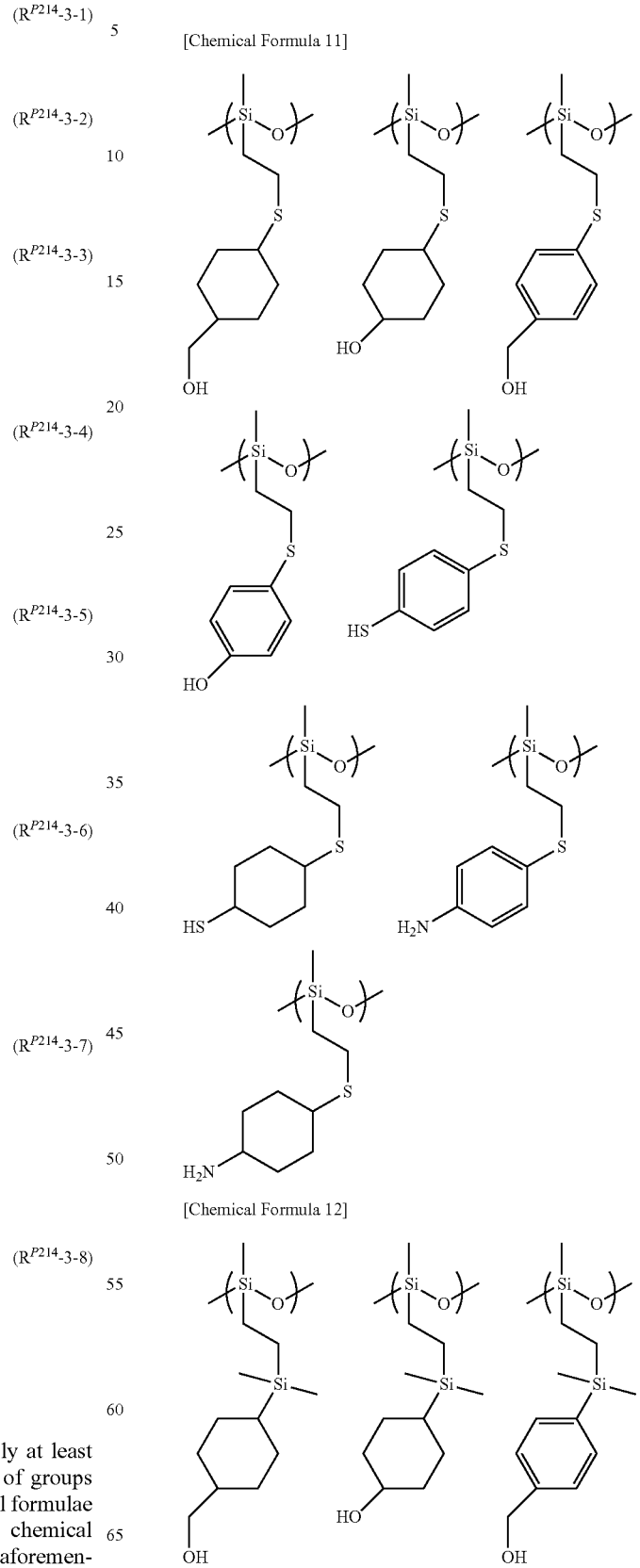

[Chemical Formula 12]

-continued
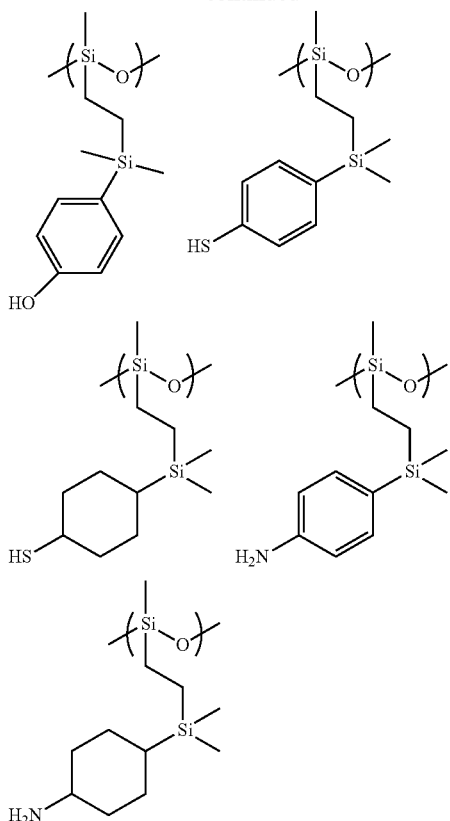
[Chemical Formula 13]
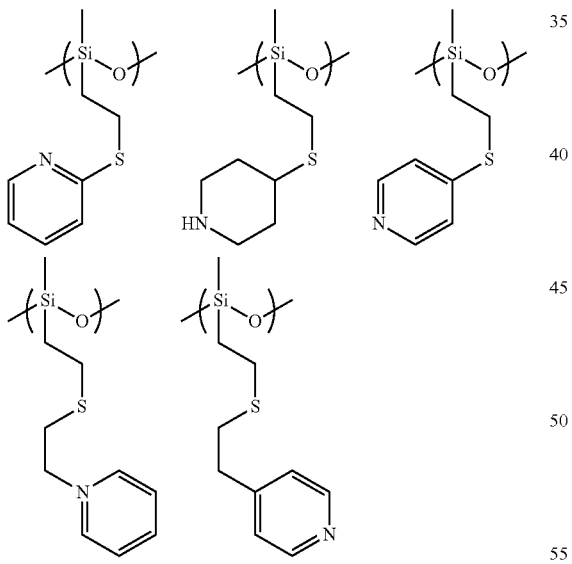
[Chemical Formula 14]
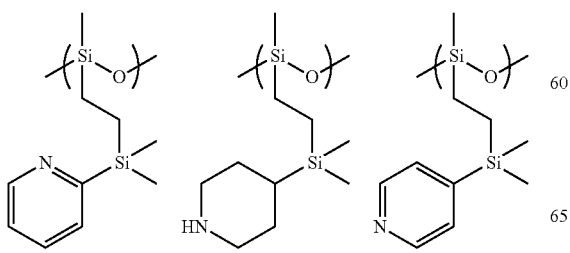
-continued
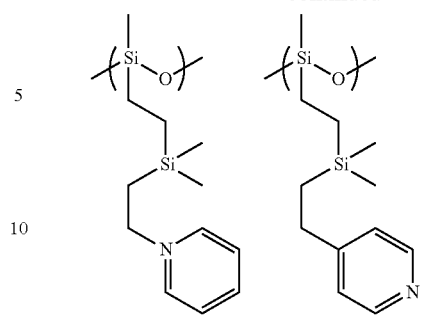
Specific examples of the structure represented by general formula (1-1-2) are shown below.
[Chemical Formula 15]
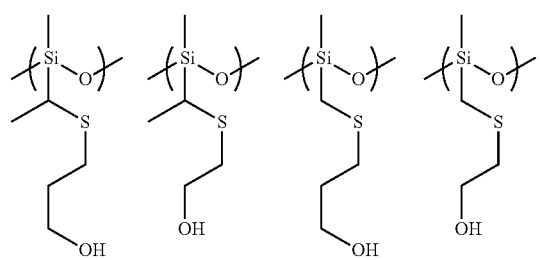
[Chemical Formula 16]
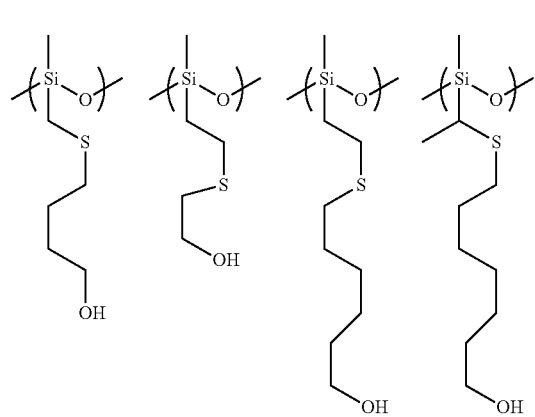
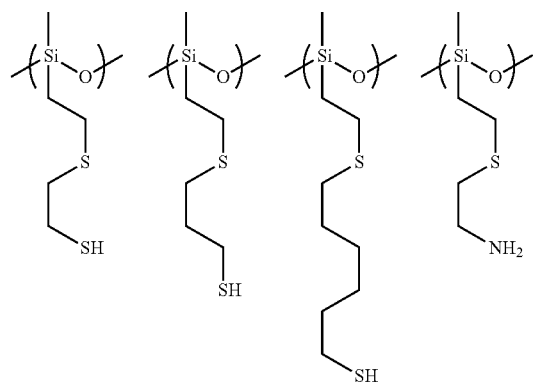

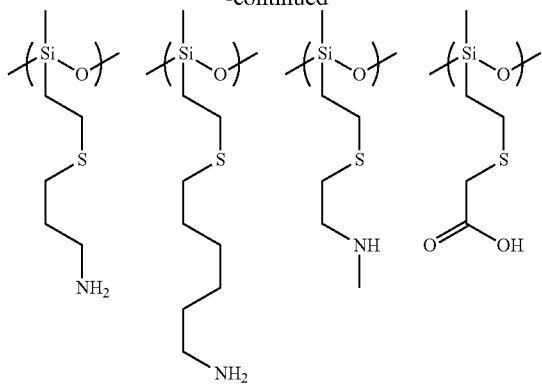
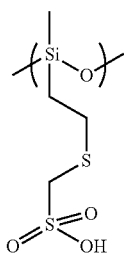

[Chemical Formula 17]

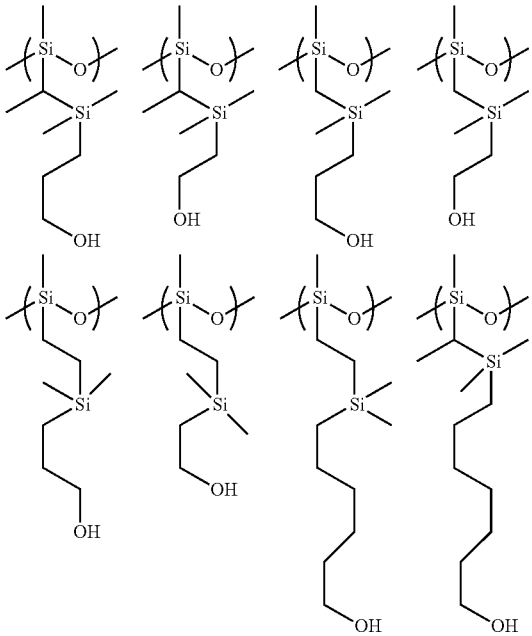

[Chemical Formula 18]

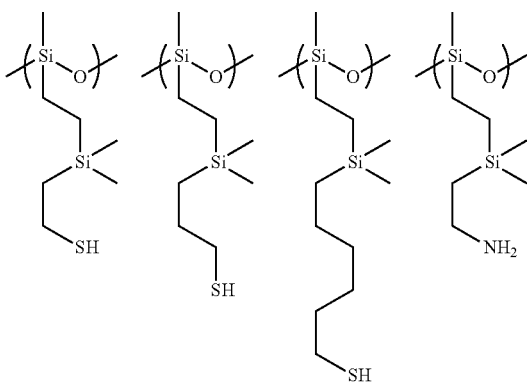

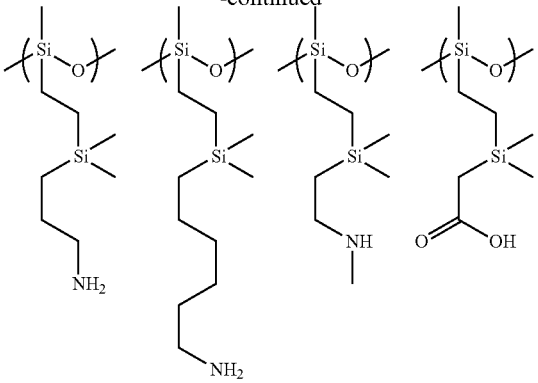
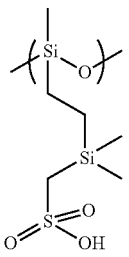

(Structural Unit (u22))

The structural unit (u22) is not particularly limited as long as it is a structural unit other than the structural unit (u21) and containing a silicon atom. As the structural unit (u22), a structural unit (221) derived from siloxane or a structural unit (u222) represented by general formula (u2-2-2) shown below is preferable, and a structural unit (221) derived from siloxane is more preferable.

[Chemical Formula 19]

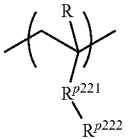

(u2-2-2)

In the formula, R represents a hydrogen atom, an alkyl group of 1 to 5 carbon atoms or a halogenated alkyl group of 1 to 5 carbon atoms; $R^{P221}$ represents a divalent linking group; and $R^{P222}$ represents an organic group having a silicon atom.

(Structural unit (221)) Examples of the structural unit (221) include a structural unit derived from dimethylsiloxane, a structural unit derived from diethylsiloxane, a structural unit derived from diphenylsiloxane, and a structural unit derived from methylphenylsiloxane.

Among these examples, as the structural unit (u221), a structural unit derived from dimethylsiloxane is preferable.

(Structural Unit (222))

In general formula (u2-2-2), R represents a hydrogen atom, an alkyl group of 1 to 5 carbon atoms or a halogenated alkyl group of 1 to 5 carbon atoms, and is the same as defined for R in general formula (u2-1-1).

Among these examples, as R, a methyl group or a hydrogen atom is preferable.

In general formula (u2-2-2), $R^{P221}$ represents a divalent linking group. The divalent linking group represented by $R^{P221}$ is the same as defined for the divalent linking group represented by $R^{P213}$ in general formula (u2-1-1). Among these examples, as the divalent linking group represented by $R^{P221}$, a divalent linking group containing a hetero atom or a divalent aromatic hydrocarbon group is preferable, —O—, —C(=O)—O—, —C(=O)—, —O—C(=O)—O—, —C(=O)—NH—, —NH—, —NH—C(=NH)— (H may be substituted with a substituent such as an alkyl group, an acyl group or the like), —S—, —S(=O)$_2$—, —S(=O)$_2$—O—, a group represented by general formula: —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m''}$—Y$^{22}$—, —Y$^{21}$—O—C(O)—Y$^{22}$— or —Y$^{21}$—S(=O)$_2$—O—Y$^{22}$— [in the formulae, Y$^{21}$ and Y$^{22}$ each independently represents a divalent hydrocarbon group which may have a substituent, O represents an oxygen atom, and m'' represents an integer of 0 to 3], a phenylene group, a naphthylene group, an anthracenylene group or a phenanthrenylene group is more preferable, and —C(=O)—O— or a phenylene group is still more preferable.

In general formula (u2-2-2), $R^{P222}$ represents an organic group having a silicon atom. $R^{P222}$ is not particularly limited, and is preferably at least one member selected from the group consisting of an organic group represented by any one of chemical formulae ($R^{P222}$-1) to ($R^{P222}$-3) shown below.

[Chemical Formula 20]

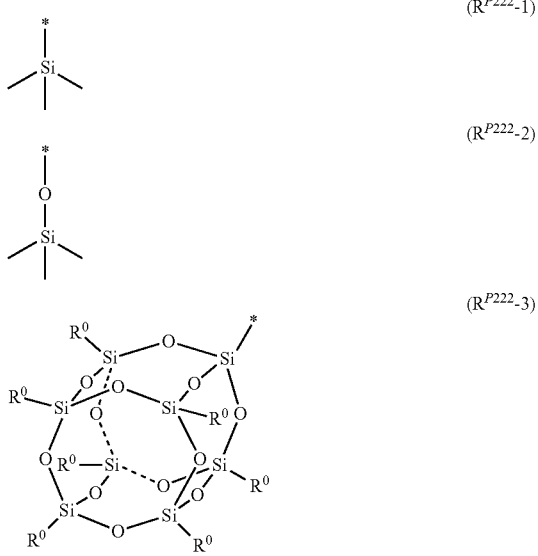

($R^{P222}$-1)

($R^{P222}$-2)

($R^{P222}$-3)

In the formula, $R^0$ represents a monovalent hydrocarbon group which may have a substituent. The plurality of $R^0$ may be the same or different from each other.

In general formula ($R^{P222}$-3), the "monovalent hydrocarbon group which may have a substituent" represented by $R^0$ is the same as defined for the "monovalent hydrocarbon group which may have a substituent" described above for $R^{P211}$ in the aforementioned general formula (u2-1). Among these examples, as $R^0$, an ethyl group or an isobutyl group is preferable.

In the present embodiment, the number average molecular weight (Mn) (the polystyrene equivalent value determined by gel permeation chromatography) of the block copolymer is preferably 5,000 to 2,000,000, more preferably 5,000 to 1,000,000, and still more preferably 5,000 to 500,000.

The polydispersity (Mw/Mn) of the block copolymer is preferably 1.0 to 3.0, more preferably 1.0 to 1.5, and still more preferably 1.0 to 1.3. Mw indicates the weight average molecular weight.

In the present embodiment, the amount of the block (b22) based on the total amount (100 mol %) of the first block, the block (b21) and the block (b22) is preferably 1 to 50 mol %, more preferably 1 to 45 mol %, and still more preferably 1 to 40 mol %. When the amount of the block (b22) is within the above-mentioned range, the interface thickness between the first block and the block (b22) may be more reliably decreased, and the roughness of the pattern after dry etching may be more reliably reduced.

Further, the amount of the first block based on the total amount (100 mol %) of the first block, the block (b21) and the block (b22) is preferably 25 to 85 mol %, more preferably 30 to 80 mol %, and still more preferably 40 to 70 mol %.

Furthermore, the amount of the block (b21) based on the total amount (100 mol %) of the first block, the block (b21) and the block (b22) is preferably 5 to 45 mol %, more preferably 10 to 40 mol %, and still more preferably 15 to 35 mol %.

The block copolymer according to the present embodiment may be preferably used as a resin composition for forming a phase-separated structure. In the case of using the block copolymer as a resin composition for forming a phase-separated structure, it is preferable to prepare the resin composition by dissolving the block copolymer according to the present embodiment in an organic solvent.

Organic Solvent

The organic solvent may be any organic solvent which can dissolve the respective components to give a uniform solution, and one or more kinds of any organic solvent can be appropriately selected from those which have been conventionally known as solvents for a film composition containing a resin as a main component.

Examples thereof include halogenated hydrocarbons such as methylchloride, dichloromethane, chloroform, ethyl chloride, dichloroethane, n-propylchloride, n-butylchloride and chlorobenzene; lactones such as γ-butyrolactone; ketones such as acetone, methyl ethyl ketone, cyclohexanone, methyl-n-pentyl ketone, methyl isopentyl ketone, and 2-heptanone (methylamyl ketone); polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

These solvents can be used individually, or in combination as a mixed solvent.

Among these examples, chloroform, 2-heptanone, propylene glycol monomethyl ether acetate (PGMEA), propylene glycol monomethyl ether (PGME), cyclohexanone and EL is preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2. For example, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA: PGME weight ratio is preferably from 1:9 to 9:1, more preferably from 2:8 to 8:2, and still more preferably 3:7 to 7:3. Alternatively, when PGME and cyclohexanone is mixed as the polar solvent, the PGMEA:(PGME+cyclohexanone) weight ratio is preferably from 1:9 to 9:1, more preferably from 2:8 to 8:2, and still more preferably 3:7 to 7:3.

Further, as the organic solvent for the resin composition for forming a phase-separated structure, a mixed solvent of γ-butyrolactone with PGMEA, EL or the aforementioned mixed solvent of PGMEA with a polar solvent, is also preferable. The mixing ratio (former:latter) of such a mixed solvent is preferably from 70:30 to 95:5. The amount of the organic solvent in the resin composition for forming a phase-separated structure is not particularly limited, and is adjusted appropriately to a concentration that enables application of a coating solution depending on the thickness of the coating film. In general, the organic solvent is used in an amount that yields a solid content for the block copolymer that is within a range from 0.2 to 70% by weight, and preferably from 0.2 to 50% by weight.

The block copolymer according to the present embodiment is capable of forming a regular periodic structure. Therefore, the block copolymer according to the present embodiment is preferable for self-directed assembly lithography.

The block copolymer according to the present embodiment includes the first block and the second block, and the second block contains the block (b21) and the block (b22).

The block (b21) and the block (b22) both contain a silicon atom.

Therefore, in the case where a phase-separated structure is formed using the block copolymer according to the present embodiment, by conducting dry etching using oxygen plasma or the like, the first block can be selectively removed.

The block (b22) is positioned between the first block and the block (b21). Therefore, in the case where a phase-separated structure is formed using the block copolymer according to the present embodiment, and dry etching is conducted to form a pattern, the interface between the first block and the block (b22) becomes the edge portion. The block (b22) exhibits a high repulsive interaction relative to the first block. Therefore, it is presumed that the interface thickness between the first block and the block (b22) can be decreased, and the roughness of the pattern after dry etching can be reduced.

Further, the difference in the surface free energy between the first block and the block (b21) is small. Therefore, it is presumed that, in the case of forming a phase-separated structure using the block copolymer according to the present embodiment, a perpendicularly oriented pattern can be reliably formed by heat annealing.

<<Method of Producing Block Copolymer>>

A method of producing a block copolymer according to the present embodiment includes: a step (a) of preparing a first block consisting of a polymer having a repeating structure of a structural unit (u11) represented by general formula (u1-1) shown below or a polymer having a repeating structure of a structural unit (u12) derived from an acrylate ester which may have the hydrogen atom bonded to the carbon atom on the α-position substituted with a substituent, a step (b) of conducting addition polymerization of a siloxane or a monomer (m222) represented by general formula (m2-2-2) shown below with the first block prepared in the step (a), to prepare a block copolymer precursor in which the first block is bonded to a block (b22), and a step (c) of conducting addition polymerization of a monomer (m21) which derives a structural unit (u21) represented by general formula (u2-1) shown below with the block copolymer precursor prepared in the step (b), to prepare a block copolymer in which the block (b22) is positioned between the first block and a block (b21).

[Chemical Formula 21]

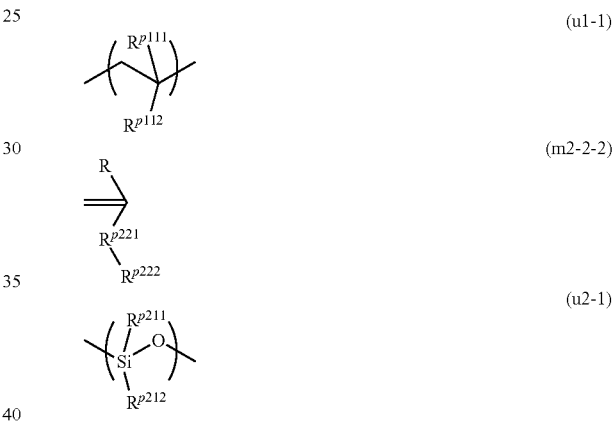

wherein $R^{P111}$ represents an alkyl group, a halogenated alkyl group or a hydrogen atom; $R^{P112}$ represents an aromatic cyclic group which may have a substituent; R represents a hydrogen atom, an alkyl group having 1 to 5 carbon atoms or a halogenated alkyl group having 1 to 5 carbon atoms; $R^{P221}$ represents a divalent linking group; $R^{P222}$ represents an organic group having a silicon atom; $R^{P211}$ represents an alkyl group, a halogenated alkyl group, a hydrogen atom, or an organic group having a polar group; and $R^{P212}$ represents an organic group having a polar group.

In general formula (u1-1), $R^{P111}$ and $R^{P112}$ are the same as defined above.

In general formula (m2-2-2), R, $R^{P221}$ and $R^{P222}$ are the same as defined for R, $R^{P221}$ and $R^{P222}$ in the aforementioned general formula (u2-2-2).

In general formula (u2-1), $R^{P211}$ and $R^{P212}$ are the same as defined above.

(Step (a))

In step (a), a first block is prepared. The method of preparing the first block is not particularly limited, and a conventional polymerization method may be used. For example, a monomer which derived a structural unit (u11) or a monomer which derives a structural unit (u12) may be subjected to a polymerization reaction in an organic solvent in the presence of a living anion polymerization initiator such as sec-butyllithium (SecBuLi). The reaction temperature is not particularly limited, and a temperature at which the polydispersity of the first block becomes narrow is preferable.

(Step (b))

In step (b), an addition polymerization of a siloxane or a monomer (m222) with the first block prepared in the step (a) is conducted, to prepare a block copolymer precursor in which the first block is bonded to a block (b22). The addition polymerization reaction in step (b) may be conducted by a conventional method such as living anion polymerization. The reaction temperature in step (b) is not particularly limited. However, in consideration of the polydispersity of the block copolymer precursor and the reaction temperature in step (c), step (b) is conducted at preferably 0° C. to 80° C., more preferably 5° C. to 60° C., and still more preferably 10° C. to 40° C.

(Step (c))

In step (c), an addition polymerization of a monomer (m21) which derives a structural unit (u21) with the block copolymer precursor prepared in the step (b) is conducted, to prepare a block copolymer in which the block (b22) is positioned between the first block and a block (b21).

In step (c), the reaction temperature of the addition polymerization of the monomer (m21) with the block copolymer precursor is adjusted to be lower than the reaction temperature of the addition polymerization of the siloxane or the monomer (m222) with the first block. In this manner, the addition polymerization reaction of the monomer (m21) can be proceeded prior to the reaction of the residual siloxane or monomer (m222) after step (b). As a result, a block copolymer in which the block (b22) is positioned between the first block and the block (b21) can be prepared.

The reaction temperature in the addition polymerization of the monomer (m21) with the block copolymer precursor is preferably a temperature at which the siloxane or the monomer (m22) does not react. Specifically, the reaction temperature in the addition polymerization of the monomer (m21) with the block copolymer precursor, relative to the reaction temperature of the addition polymerization of the siloxane or the monomer (m222) with the first block is preferably 20° C. or lower, more preferably 30° C. or lower, and still more preferably 40° C. or lower.

The solvent used in the polymerization reaction in each of steps (a), (b) and (c) is not particularly limited, and any solvent which is capable of dissolving the compounds used in each step and does not react with the compounds may be used. Examples of the solvent include tetrahydrofuran, N,N-dimethylformamide, dimethylacetamide, hexane, cyclohexane, toluene and N-methylpyrrolidone.

In the present embodiment, instead of conducting step (c), a step (c-1) of conducting addition polymerization of a monomer (m21') which derives a structural unit (u21') represented by general formula (u2-1') with the block copolymer precursor obtained in step (b), to prepare a block copolymer in which a block (b22) is positioned between the first block and the block (b21'), and a step (c-2) of reacting a compound containing an organic group having a polar group with the block copolymer prepared in step (c-1) may be conducted, to prepare a block copolymer in which the first block and the block (b22) are bonded. In this case, in step (c-1), the reaction temperature of the addition polymerization of the monomer (m21') with the block copolymer precursor is adjusted to be lower than the reaction temperature of the addition polymerization of the siloxane or the monomer (m222) with the first block.

[Chemical Formula 22]

(u2-1')

In the formula, $R^{P211'}$ represents an alkyl group, a halogenated alkyl group, a hydrogen atom or an organic group containing a reactive group; and $R^{P212'}$ represents an organic group containing a reactive group.

(Step (c-1))

In step (c-1), addition polymerization of a monomer (m21') which derives a structural unit (u21') represented by general formula (u2-1') with the block copolymer precursor obtained in step (b) is conducted, to prepare a block copolymer in which a block (b22) is positioned between the first block and the block (b21')

In general formula (u2-1'), $R^{P211'}$ represents an alkyl group, a halogenated alkyl group, a hydrogen atom or an organic group containing a reactive group.

An "organic group containing a reactive group" includes a reactive group itself.

A reactive group refers to a group which is capable of reacting with another portion by a chemical reaction.

Examples of the reactive group include a vinyl group, an allyl group, a (meth)acryloyl group, a styryl group, an oxiranyl group, an oxetanyl group, a carboxy group, a hydroxy group, a thiacyclopropyl group, a sulfanyl group, an isocyanato group, an amino group and an ureido group. Among these examples, as the reactive group, a vinyl group or an allyl group is preferable, and a vinyl group is most preferable.

The organic group for $R^{P211'}$ is not particularly limited, and examples thereof include the "monovalent hydrocarbon group which may have a substituent" represented by $R^{P211'}$ in the aforementioned general formula (u2-1).

The alkyl group and the halogenated alkyl group for $R^{P211'}$ are the same as defined for the alkyl group and the halogenated alkyl group for $R^{P211}$ in the aforementioned general formula (u2-1), respectively.

Among these examples, as $R^{P211'}$, an alkyl group, a halogenated alkyl group or a hydrogen atom is preferable, an alkyl group of 1 to 5 carbon atoms, a halogenated alkyl group of 1 to 5 carbon atoms or a hydrogen atom is more preferable, and a methyl group or a hydrogen atom is most preferable.

In general formula (u2-1'), $R^{P212'}$ represents an organic group containing a reactive group.

The organic group containing a reactive group for $R^{P212'}$ is the same as defined for the organic group containing a reactive group for $R^{P211'}$ Among these examples, as $R^{P212'}$, a vinyl group, an organic group containing a vinyl group or an allyl group is preferable, and a vinyl group is most preferable.

In step (c-1), the reaction temperature of the addition polymerization of the monomer (m21') with the block copolymer precursor is adjusted to be lower than the reaction temperature of the addition polymerization of the siloxane or the monomer (m222) with the first block. In this manner, the addition polymerization reaction of the monomer (m21') can be proceeded prior to the reaction of the residual siloxane or monomer (m22) after step (b). As a result, a block copolymer in which the block (b22) is positioned between the first block and the block (b21') can be prepared.

(Step (c-2))

In step (c-2), a compound containing an organic group having a polar group is reacted with the block copolymer prepared in step (c-1). In this manner, a polar group can be introduced into the "organic group having a reactive group" represented by $R^{P211'}$ or $R^{P212'}$ in the structural unit (u21') of the block (b21'), and a block copolymer in which the first block and the block (b22) are bonded can be prepared.

The "compound containing an organic group having a polar group" is not particularly limited, as long as it is it is a compound containing an organic group having a polar group represented by $R^{P211}$ or $R^{P212}$ in the aforementioned general formula (u2-1). For example, in the case where a compound containing an organic group having a thiol group and a polar group is used, a polar group can be introduced into an organic group containing a reactive group represented by $R^{P211'}$ or $R^{P212'}$ by an ene-thiol reaction.

<<Method of Forming Structure Containing Phase-Separated Structure>>

A method of forming a structure containing a phase-separated structure using the block copolymer according to the present embodiment will be described.

The method of producing a structure containing a phase-separated structure includes a step (i) in which a layer containing the block copolymer according to the present embodiment is formed on a substrate, and a step (ii) in which the layer containing the block copolymer is phase-separated.

In the method of producing a structure containing a phase-separated structure according to the present embodiment, it is preferable to include, prior to the step (i), a step of applying a brush composition to form a brush layer (hereafter, referred to as "brush composition layer forming step").

Hereinafter, the method of producing a structure containing a phase-separated structure will be specifically described with reference to FIG. 1. However, the present invention is not limited to these embodiments.

FIG. 1 shows an example of one embodiment of the method of forming a structure containing a phase-separated structure.

Firstly, a brush composition is applied to a substrate 1, so as to form a brush layer 2 (FIG. 1 (I)).

Then, to the brush layer 2, the block copolymer according to the present embodiment is applied, so as to form a layer 3 containing the block copolymer (BCP layer) (FIG. 1(II); step (i)).

Next, heating is conducted to perform an annealing treatment, so as to phase-separate the BCP layer 3 into a phase 3a and a phase 3b (FIG. 1 (III); step (ii)).

According to the production method of the present embodiment, that is, the production method including the steps (i) and (ii), a structure 3' containing a phase-separated structure is formed on the substrate 1 having the brush layer 2 formed thereon.

[Step (i)]

In step (i), the block copolymer is applied to the substrate 1, so as to form a BCP layer 3.

There are no particular limitations on the kind of the substrate, provided that the block copolymer can be coated on the surface of the substrate.

Examples of the substrate include a substrate constituted of an inorganic substance such as a metal (e.g., silicon, copper, chromium, iron or aluminum), glass, titanium oxide, silica or mica; and a substrate constituted of an organic substance such as an acrylic plate, polystyrene, cellulose, cellulose acetate or phenol resin.

The size and the shape of the substrate is not particularly limited. The substrate does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

On the surface of the substrate, an inorganic and/or organic film may be provided. As the inorganic film, an inorganic antireflection film (inorganic BARC) can be used. As the organic film, an organic antireflection film (organic BARC) can be used.

Before forming a BCP layer 3 on the substrate 1, the surface of the substrate 1 may be cleaned. By cleaning the surface of the substrate, application of the resin composition for forming a phase-separated structure or the brush composition to the substrate 1 may be satisfactorily performed.

As the cleaning treatment, a conventional method may be used, and examples thereof include an oxygen plasma treatment, a hydrogen plasma treatment, an ozone oxidation treatment, an acid alkali treatment, and a chemical modification treatment. For example, the substrate is immersed in an acidic solution such as a sulfuric acid/hydrogen peroxide aqueous solution, followed by washing with water and drying. Thereafter, a BCP layer 3 or a brush layer 2 is formed on the surface of the substrate.

Before forming a BCP layer 3 on the substrate 1, the surface of the substrate 1 may be subjected to a neutralization treatment.

A "neutralization treatment" is a treatment in which a surface of a substrate is modified to provide affinity for all polymers which constitute the block copolymer. By the neutralization treatment, it becomes possible to prevent only phases of specific polymers to come into contact with the surface of the substrate by phase separation. For example, prior to forming a BCP layer 3, it is preferable to form a brush layer 2 on a surface of the substrate 1, depending on the kind of block copolymer to be used. As a result, by phase-separation of the BCP layer 3, a cylinder structure or lamellar structure oriented in a direction perpendicular to the surface of the substrate 1 can be reliably formed.

Specifically, on the surface of the substrate 1, a brush layer 2 is formed using a brush composition having affinity for all polymers constituting the block copolymer.

The brush composition can be appropriately selected from conventional resin compositions used for forming a thin film, depending on the kind of polymers constituting the block copolymer.

Examples of the brush composition include a composition containing a resin which has all structural units of the polymers constituting the block copolymer, and a composition containing a resin which has all structural units having high affinity for the polymers constituting the block copolymer.

For example, when a PS-PMMA block copolymer is used, as the brush composition, it is preferable to use a resin composition containing both PS and PMMA, or a compound or a composition containing both a portion having a high affinity for an aromatic ring and a portion having a high affinity for a functional group with high polarity.

Examples of the resin composition containing both PS and PMMA include a random copolymer of PS and PMMA, an alternating polymer of PS and PMMA (a copolymer in which the respective monomers are alternately copolymerized)

Examples of the composition containing both a portion having a high affinity for PS and a portion having a high affinity for PMMA include a resin composition obtained by polymerizing at least a monomer having an aromatic ring and a monomer having a substituent with high polarity. Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom. Examples of the monomer having a substituent with high polarity include a monomer having a carboxy group, a hydroxy group, a cyano group or a hydroxyalkyl group in which part of the hydrogen atoms of the alkyl group has been substituted with fluorine atoms.

Further, as the brush composition, for example, a heat-polymerizable resin composition, or a photosensitive resin composition such as a positive resist composition or a negative resist composition can also be mentioned.

The brush layer may be formed by a conventional method.

The method of applying the brush composition to the substrate 1 to form a brush layer 2 is not particularly limited, and the brush layer 2 can be formed by a conventional method.

For example, the brush composition can be applied to the substrate 1 by a conventional method using a spinner or the like to form a coating film on the substrate 1, followed by drying, thereby forming a brush layer 2.

The drying method of the coating film is not particularly limited, provided that it can volatilize the solvent contained in the brush composition, and the coating film is immobilized on the substrate. Examples of the drying method include a method in which baking is conducted. The baking temperature is preferably 80° C. to 300° C., more preferably 90° C. to 270° C., and still more preferably 100° C. to 250° C. The baking time is preferably 30 seconds to 500 seconds, and more preferably 30 seconds to 250 seconds.

The thickness of the brush layer 2 after drying of the coating film is preferably about 3 to 100 nm, and more preferably about 5 to 50 nm.

Subsequently, on the brush layer 2, a layer 3 containing a block copolymer having a plurality of blocks bonded (BCP layer 3) is formed.

The method of forming the BCP layer 3 on the brush layer 2 is not particularly limited, and examples thereof include a method in which the resin composition is applied to the brush layer 2 by a conventional method using spincoating or a spinner, followed by drying.

Regarding the method of drying the coating film of the resin composition, the baking is temperature is, for example, preferably from 60 to 150° C., and more preferably from 80 to 130° C. The baking time is, for example, preferably from 10 to 3,000 seconds, and more preferably from 20 to 120 seconds.

The BCP layer 3 may have a thickness satisfactory for phase-separation to occur. In consideration of the kind of the substrate 1, the structure period size of the phase-separated structure to be formed, and the uniformity of the nanostructure, the thickness is preferably 10 to 100 nm, and more preferably 15 to 80 nm.

[Step (ii)]

In step (ii), the layer 3 containing a block copolymer formed on the substrate 1 is phase-separated.

By heating the substrate 1 after step (i) to conduct the anneal treatment, the block copolymer is selectively removed, such that a phase-separated structure in which at least part of the surface of the substrate 1 is exposed is formed. That is, on the substrate 1, a structure 3' containing a phase-separated structure in which phase 3a and phase 3b are phase separated is produced.

The anneal treatment is preferably conducted at a temperature at least as high as the glass transition temperature of the block copolymer used and lower than the heat decomposition temperature. For example, in the case where the block copolymer according to the present embodiment is used, the anneal treatment is preferably conducted at 40 to 350° C., more preferably 50 to 300° C., and most preferably 70 to 120° C. The heating time is preferably 30 to 3,600 seconds, and more preferably 120 to 600 seconds.

Further, the anneal treatment is preferably conducted in a low reactive gas such as nitrogen.

By the method of producing a structure containing a phase-separated structure according to the present embodiment described heretofore, the phase-separation performance of the block copolymer can be enhanced, and a fine structure with a good shape can be formed, as compared to conventional lithography techniques.

In addition, on the surface of the substrate, a substrate provided with a nanostructure which has the position and the orientation designed more freely can be produced. For example, by appropriately controlling the affinity of the formed structure for the substrate, a phase-separated structure with a cylinder structure or lamellar structure oriented in a direction perpendicular to the surface of the substrate can be more reliably formed.

[Optional Step]

The method of forming a structure containing a phase-separated structure according to the second aspect of the present invention is not limited to the above embodiment, and may include a step (optional step) other than steps (i) and (ii).

Examples of the optional steps include a step of selectively removing a phase constituted of at least one block of the plurality of blocks constituting the block copolymer contained in the BCP layer 3 (hereafter, referred to as "step (iii)"), and a guide pattern formation step.

Step (iii)

In step (iii), from the BCP layer 3 formed on the brush layer 2, a phase constituted of at least one block of the plurality of blocks constituting the block copolymer (phase 3a and phase 3b) is selectively removed. In this manner, a fine pattern (polymeric nanostructure) can be formed.

Examples of the method of selectively removing a phase constituted of a block include a method in which an oxygen plasma treatment or a hydrogen plasma treatment is conducted on the BCP layer.

Hereafter, among the blocks constituting the block copolymer, a block which is not selectively removed is referred to as "block PA", and a block to be selectively removed is referred to as "block PB". For example, after the phase separation of a layer containing the block copolymer according to the present embodiment, by subjecting the layer to an oxygen plasma treatment or a hydrogen plasma treatment, the phase of the second block can be selectively removed. In such a case, the first block portion is the block PA, and the second block portion is the block PB.

Figure 2:
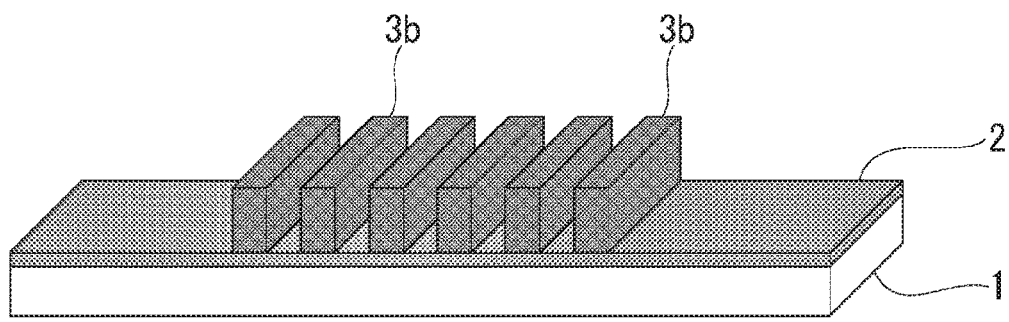
FIG. 2 is an explanatory diagram showing an example of one embodiment of an optional step.

FIG. 2 shows an example of one embodiment of step (iii).

In the embodiment shown in FIG. 2, by conducting oxygen plasma treatment on the structure 3' produced on the substrate 1 in step (ii), the phase 3a is selectively removed, and a pattern (polymeric nanostructure) constituted of phases 3b separated from each other is formed. In this case, the phase 3b is the phase constituted of the block PA, and the phase 3a is the phase constituted of the block PB.

The substrate 1 having a pattern formed by phase-separation of the BCP layer 3 as described above may be used as it is, or may be further heated to modify the shape of the pattern (polymeric nanostructure) on the substrate 1.

The heat treatment is preferably conducted at a temperature at least as high as the glass transition temperature of the block copolymer used and lower than the heat decomposition temperature. Further, the heating is preferably conducted in a low reactive gas such as nitrogen.

Guide Pattern Forming Step

In the method of forming a structure containing a phase-separated structure according to the second aspect of the present invention, a step of forming a guide pattern on the brush layer (guide pattern forming step) may be included. In this manner, it becomes possible to control the arrangement of the phase-separated structure.

For example, in the case of a block copolymer where a random fingerprint-patterned phase separation structure is formed without using a guide pattern, by providing a trench pattern of a resist film on the surface of the brush layer, a phase separation structure arranged along the trench can be obtained. The guide pattern can be provided on the brush layer 2 in accordance with the above-described principle. Further, when the surface of the guide pattern has affinity for any of the polymers constituting the block copolymer, a phase separation structure having a cylinder structure or lamellar structure arranged in the perpendicular direction of the surface of the substrate can be more reliably formed.

The guide pattern can be formed, for example, using a resist composition.

The resist composition for forming the guide pattern can be appropriately selected from resist compositions or a modified product thereof typically used for forming a resist pattern which have affinity for any of the polymers constituting the block copolymer. The resist composition may be either a positive resist composition capable of forming a positive pattern in which exposed portions of the resist film are dissolved and removed, or a negative resist pattern capable of forming a negative pattern in which unexposed portions of the resist film are dissolved and removed, but a negative resist composition is preferable. As the negative resist composition, for example, a resist composition containing an acid-generator component and a base component which exhibits decreased solubility in an organic solvent-containing developing solution under action of acid, wherein the base component contains a resin component having a structural unit which is decomposed by action of acid to exhibit increased polarity, is preferable.

When the resin composition is cast onto the brush layer having the guide pattern formed thereon, an anneal treatment is conducted to cause phase-separation. Therefore, the resist pattern for forming a guide pattern is preferably capable of forming a resist film which exhibits solvent resistance and heat resistance.

EXAMPLES

The present invention will be described more specifically with reference to the following examples, although the scope of the present invention is by no way limited by these examples.

Synthesis Example 1: Synthesis of PS-b-PDMS-b-PMVS

In an Ar atmosphere, 10 ml of THF was added to a reaction vessel, and cooled to −78° C. A predetermined amount of SecBuLi (a hexane/cyclohexane mixed solution) and 0.40 g of styrene were added, followed by stirring at −78° C. for 30 minutes. Then, 0.40 g of hexamethylcyclotrisiloxane was added, and the liquid temperature was changed to 20° C., followed by stirring for 48 hours. Subsequently, the liquid temperature was changed to −20° C., and 0.40 g of trimethyltrivinylcyclotrisiloxane was added, followed by stirring for 48 hours. Then, 0.20 g of trimethylsilylchloride was added, and the reaction solution was added to 200 ml of methanol. The precipitated solid was collected by filtration. The collected solid was dried, so as to obtain 0.60 g of PS-b-PDMS-b-PMVS (hereafter, referred to as "block copolymer (1')"). The obtained block copolymer (1') had a Mn of 15,000, and a PDI of 1.10 (in terms of GPC). Further, the ratio of the repeating units in the obtained polymer was styrene:dimethylsiloxane:methylvinylsiloxane (n:l:m)=60:15:25 (molar ratio) ($^1$H-NMR).

[Chemical Formula 23]

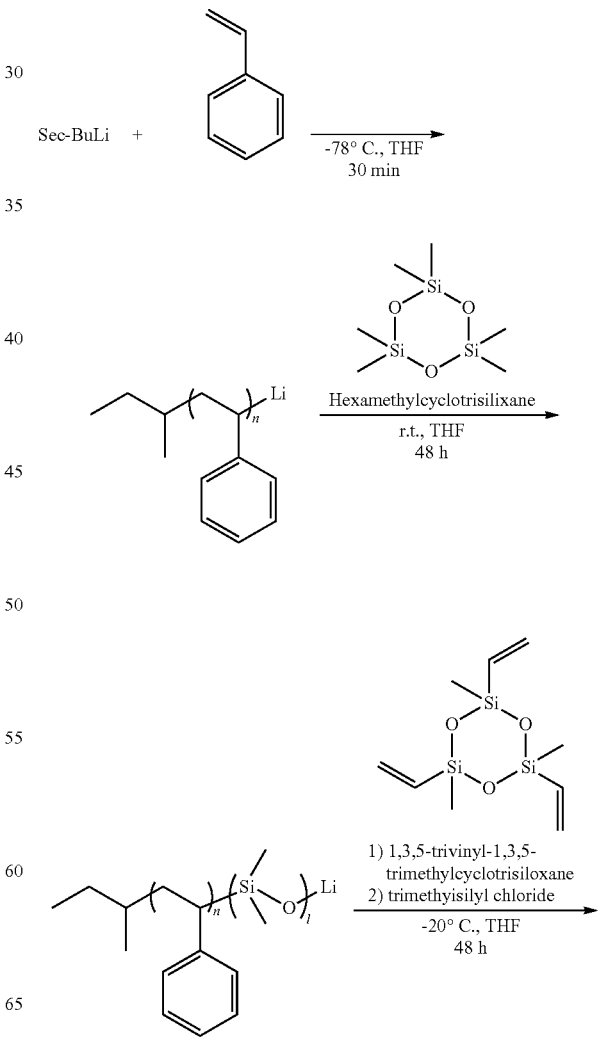

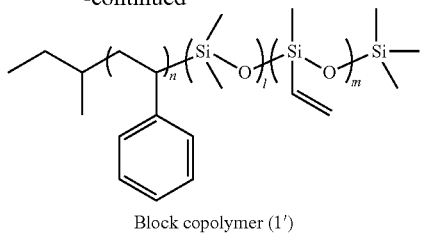

Block copolymer (1')

Synthesis Example 2

PS-b-PDMS-b-PMVS (hereafter, referred to as "block copolymer (2')") was synthesized in the same manner as in Synthesis Example 1.

The obtained block copolymer (2') had an Mn of 18,800, and a PDI of 1.23 (in terms of GPC). Further, the ratio of the repeating units in the obtained polymer was styrene:dimethylsiloxane:methylvinylsiloxane (n:l:m)=52:18:30 (molar ratio) ($^1$H-NMR).

[Chemical Formula 24]

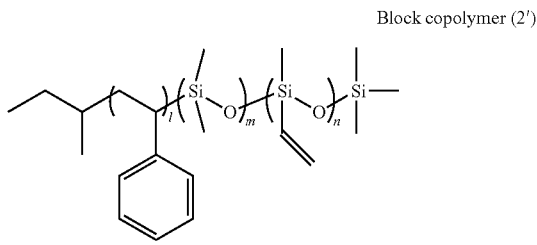

Block copolymer (2')

Synthesis Example 3

PS-b-PDMS-b-PMVS (hereafter, referred to as "block copolymer (3')") was synthesized in the same manner as in Synthesis Example 1.

The obtained block copolymer (3') had a Mn of 25,100, and a PDI of 1.22 (in terms of GPC). Further, the ratio of the repeating units in the obtained polymer was styrene:dimethylsiloxane:methylvinylsiloxane (n:l:m)=46:35:19 (molar ratio) ($^1$H-NMR).

[Chemical formula 25]

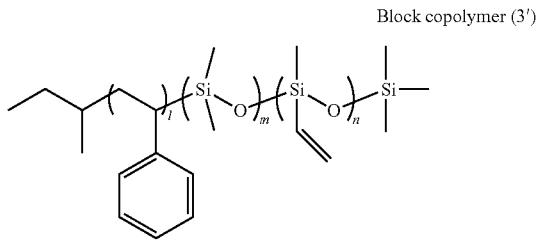

Block copolymer (3')

Example 1: Synthesis of PS-b-PDMS-b-PMHxOHS 0.10 g of block copolymer (1'), 0.007 g of azobisisobutyronitrile (AIBN), 0.54 g of 6-mercapto-1-hexanol and 0.8 ml of THF were placed in a reaction vessel, and the reaction vessel was purged with Ar, followed by freeze degassing 3 times. Stirring was conducted at 65° C. for 4 hours, followed by rapid cooling with an ice bath and liquid nitrogen. The reaction solution was poured into 100 ml of pure water, followed by collecting the precipitated solid by filtration. The re-precipitation in pure water was conducted three times. The collected solid was dried, so as to obtain 0.11 g of PS-b-PDMS-b-PMHxOHS (a block copolymer consisting of a block of styrene, a block of dimethylsiloxane and a block of siloxane derivative A, represented by the following structural formula; hereafter, referred to as "block copolymer (1)"). The obtained block copolymer (1) had an Mn of 13,400, a PDI of 1.12 (in terms of GPC), and a ratio of stryene:dimethylsiloxane:siloxane derivative A=60:15:25 (molar ratio) ($^1$H-NMR).

[Chemical Formula 26]

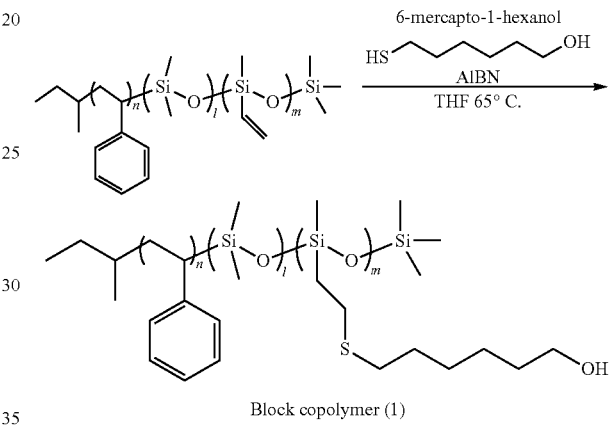

Block copolymer (1)

Example 2

0.10 g of block copolymer (2'), 0.009 g of azobisisobutyronitrile (AIBN), 0.45 g of 3-mercapto-1-propanol and 0.8 ml of THF were placed in a reaction vessel, and the reaction vessel was purged with Ar, followed by freeze degassing 3 times. Stirring was conducted at 65° C. for 4 hours, followed by rapid cooling with an ice bath and liquid nitrogen. The reaction solution was poured into 100 ml of pure water, followed by collecting the precipitated solid by filtration. The re-precipitation in pure water was conducted three times. The collected solid was dried, so as to obtain 1.1 g of a block copolymer consisting of a block of styrene, a block of dimethylsiloxane and a block of siloxane derivative B (hereafter, referred to as "block copolymer (2)"). The obtained block copolymer (2) had a Mn of 16,100, a PDI of 1.16 (in terms of GPC), and a ratio of stryene:dimethylsiloxane:siloxane derivative B=52:18:30 (molar ratio) ($^1$H-NMR).

[Chemical Formula 27]

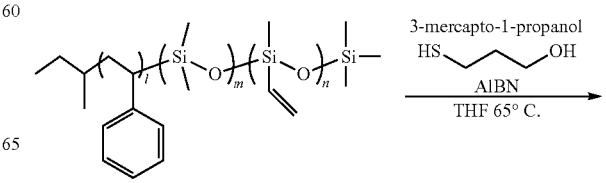

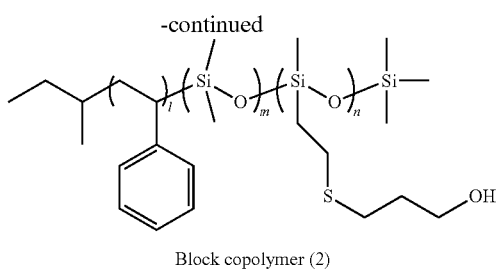

Block copolymer (2)

Example 3

0.10 g of block copolymer (3'), 0.006 g of azobisisobutyronitrile (AIBN), 0.29 g of 3-mercapto-1-propanol and 0.8 ml of THF were placed in a reaction vessel, and the reaction vessel was purged with Ar, followed by freeze degassing 3 times. Stirring was conducted at 65° C. for 4 hours, followed by rapid cooling with an ice bath and liquid nitrogen. The reaction solution was poured into 100 ml of pure water, followed by collecting the precipitated solid by filtration. The re-precipitation in pure water was conducted three times. The collected solid was dried, so as to obtain 1.1 g of a block copolymer consisting of a block of styrene, a block of dimethylsiloxane and a block of siloxane derivative B (hereafter, referred to as "block copolymer (3)"). The obtained block copolymer (3) had a Mn of 21,800, a PDI of 1.17 (in terms of GPC), and a ratio of stryene:dimethylsiloxane:siloxane derivative B=46:35:19 (molar ratio) ($^1$H-NMR).

[Chemical Formula 28]

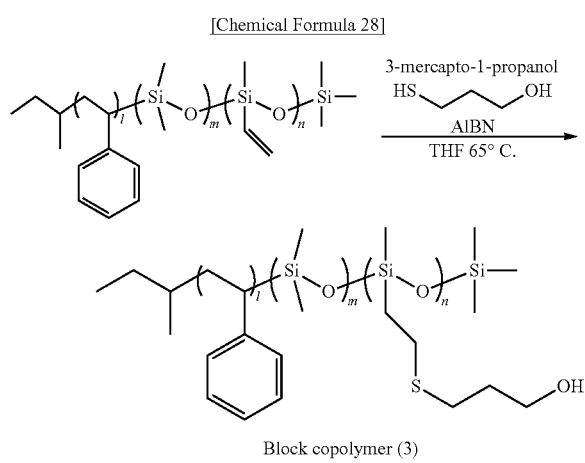

Block copolymer (3)

Example 4: Formation of Phase-Separated Structure

To an 8-inch silicon wafer, as a brush composition, a resin composition (a copolymer of methyl methacrylate/methacrylic acid=95/5 with Mw=43,400 and Mw/Mn=1.77) adjusted to a concentration of 1.0% by weight with PGMEA was applied using a spinner, followed by baking at 200° C. for 60 seconds and dried, so as tours form a brush layer having a film thickness of 20 nm on the substrate.

Subsequently, portions of the brush layer other than that adhered to the substrate was removed by a solvent (PGMEA), and a solution of block copolymer (1) (solvent: PGMEA) was spin-coated (number of rotation: 7,500 rpm, 60 seconds).

The coating film thickness of the layer containing the block copolymer (1) (hereafter, referred to as "layer of resin composition for forming phase-separated structure") was adjusted to be 16 to 20 nm.

The substrate having the resin composition for forming phase-separated structure coated thereon was heated under reduced pressure at 130° C. for 12 hours for annealing, so as to form a phase-separated structure.

Thereafter, a selective removal treatment of the block was conducted, so as to form a line and space pattern.

<Evaluation of Perpendicular Orientation>

The surface of the pattern formed in Example 4 was observed using a scanning electron microscope (SU8000; manufactured by Hitachi High-Technologies Corporation), and the perpendicular orientation was evaluated in accordance with the following criteria. The results are shown in Table 1.

A: A phase-separated structure perpendicular to the substrate was confirmed.

B: A phase-separated structure perpendicular to the substrate was not confirmed.

<Evaluation of Roughness>

The solvent was removed from the block copolymer solution under reduced pressure, followed by heating at 110° C. for 24 hours in vacuum, so as to obtain a sample in the form of a film. The obtained film was subjected to a dyeing treatment by ruthenium oxide. Then, the film was observed by TEM, and the roughness was evaluated in accordance with the following criteria.

A: Formation of bridge (connection of lines) was not observed.

B: Formation of bridge was observed.

Examples 5, 6

A phase-separated structure was formed in the same manner as in Example 4, except that block copolymer (2) or block copolymer (3) was used instead of block copolymer (1). Thereafter, a selective removal treatment of the block was conducted, so as to form a line and space pattern. With respect to the formed pattern, the perpendicular orientation and the roughness were evaluated in the same manner as in Example 4. The results are shown in Table 1.

Comparative Examples 1 to 3

A phase-separated structure was formed in the same manner as in Example 4, except that block copolymer (4) shown below, block copolymer (1') shown below or block copolymer (5) shown below was used instead of block copolymer (1). Thereafter, a selective removal treatment of the block was conducted, so as to form a line and space pattern. With respect to the formed pattern, the perpendicular orientation and the roughness were evaluated in the same manner as in Example 4. The results are shown in Table 1.

[Chemical Formula 29]

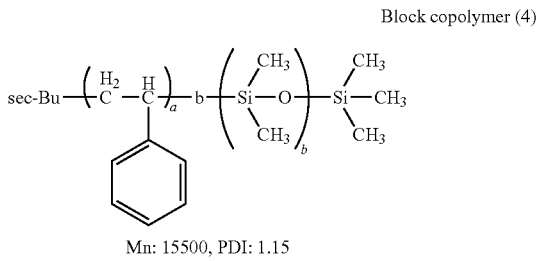

Block copolymer (4)

Mn: 15500, PDI: 1.15

-continued

Block copolymer (1')

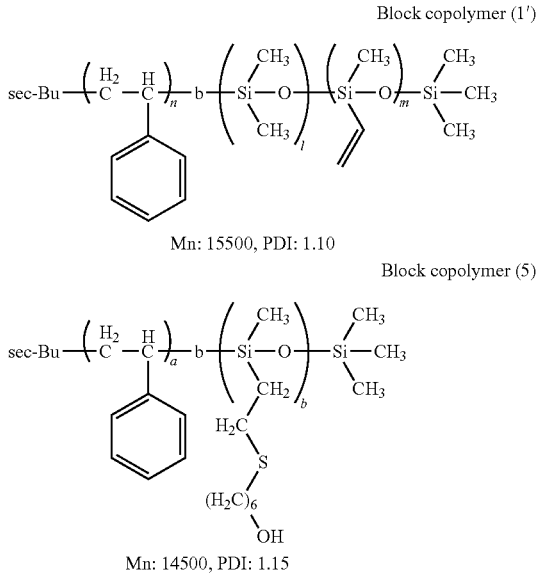

Mn: 15500, PDI: 1.10

Block copolymer (5)

Mn: 14500, PDI: 1.15

TABLE 1

|  | Block copolymer | Perpendicular orientation | Roughness |
|---|---|---|---|
| Example 4 | Block copolymer (1) | A | A |
| Example 5 | Block copolymer (2) | A | A |
| Example 6 | Block copolymer (3) | A | A |
| Comparative Example 1 | Block copolymer (4) | B | A |
| Comparative Example 2 | Block copolymer (1') | B | A |
| Comparative Example 3 | Block copolymer (5) | A | B |

As seen from the results shown in Table 1, it was confirmed that the block copolymers of Examples 1 to 3 which applied the present invention exhibited good perpendicular orientation and improved roughness.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A block copolymer comprising:
   a first block consisting of a polymer having a repeating structure of a structural unit (u11) represented by general formula (u1-1) shown below; and
   a second block consisting of a polymer having a repeating structure of a structural unit (u2) containing a silicon atom,
   the second block containing a block (b21) consisting of a polymer having a repeating structure of a structural unit (u21) represented by general formula (u2-1-1) shown below, and a block (b22) consisting of a polymer having a repeating structure of a structural unit (221) derived from dimethylsiloxane, provided that the structural unit (u21) is excluded; and the block (b22) is positioned between the first block and the block (b21),
wherein the block copolymer has a number average molecular weight of 13,400 to 21,800 and a polydispersity of 1.12 to 1.17,
the amount of the first block based on the total amount (100 mol %) of the first block, the block(b21) and the block (b22) is 40 to 70 mol %,
the amount of the block (b21) based on the total amount (100 mol %) of the first block, the block(b21) and the block (b22) is 15 to 35 mol %, and
the amount of the block (b22) based on the total amount (100 mol %) of the first block, the block(b21) and the block (b22) is 1 to 40 mol %,

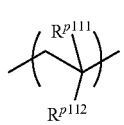

(u1-1)

wherein $R^{P111}$ represents a hydrogen atom or a methyl group; and $R^{P112}$ represents a phenyl group;

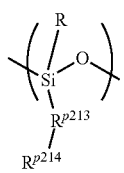

(u2-1-1)

wherein R represents a methyl group or a hydrogen atom; $R^{P213}$ represents a linear or alkylene group having 1 to 3 carbon atoms; and $R^{P214}$ is a group represented by formula ($R^{P214}$-1-9) shown below:

($R^{P214}$-1-9)

wherein np1 represents 3 or 6.

2. The block copolymer according to claim 1, wherein the amount of the block (b22) based on the total amount (100 mol %) of the first block, the block(b21) and the block (b22) is 15 to 40 mol %.

3. A method of producing a block copolymer according to claim 1, the method comprising:
   a step (a) of preparing a first block consisting of a polymer having a repeating structure of a structural unit (u11) represented by general formula (u1-1),
   a step (b) of conducting addition polymerization of dimethylsiloxane with the first block prepared in the step (a), to prepare a block copolymer precursor in which the first block is bonded to a block (b22), and
   a step (c) of conducting addition polymerization of a monomer (m21) which derives a structural unit (u21) represented by general formula (u2-1-1) with the block copolymer precursor prepared in the step (b), to prepare a block copolymer in which the block (b22) is positioned between the first block and a block (b21), wherein, in the step (c), the reaction temperature of the addition polymerization of the monomer (m21) with the block copolymer precursor is adjusted to be lower than the reaction temperature of the addition polymerization of the siloxane dimethylsiloxane with the first block.

4. A method of producing a structure containing a phase-separated structure, the method comprising:

a step (i) in which a layer containing the block copolymer according to claim 1 is formed on a substrate, and a step (ii) in which the layer containing the block copolymer is phase-separated.

5. The method according to claim 4, which comprises, prior to step (i), forming a guide pattern on the substrate.

* * * * *